United States Patent [19]

Bouadma

[11] Patent Number: 5,732,102

[45] Date of Patent: Mar. 24, 1998

[54] LASER COMPONENT HAVING A BRAGG REFLECTOR OF ORGANIC MATERIAL, AND A METHOD OF MAKING IT

[75] Inventor: Nouredine Bouadma, Gentilly, France

[73] Assignee: France Telecom, France

[21] Appl. No.: 574,687

[22] Filed: Dec. 19, 1995

[30] Foreign Application Priority Data

Dec. 20, 1994 [FR] France ................... 94 15314

[51] Int. Cl.$^6$ ....................... H01S 3/08; H01S 3/19
[52] U.S. Cl. ................... 372/96; 372/50; 437/129
[58] Field of Search ............... 372/96, 50; 385/143, 385/14, 12; 437/129

[56] References Cited

U.S. PATENT DOCUMENTS

| | | | |
|---|---|---|---|
| 4,431,263 | 2/1984 | Garito | 385/143 |
| 5,276,745 | 1/1994 | Revelli, Jr. | 385/14 |
| 5,396,328 | 3/1995 | Jestel et al. | 385/12 X |
| 5,418,802 | 5/1995 | Chwalck | 372/96 X |

FOREIGN PATENT DOCUMENTS

A-0 502   3/1992   European Pat. Off. .

OTHER PUBLICATIONS

Diemeer et al., "Polymeric Optical Waveguide Switch Using the Thermooptic Effect", Journal of Lightwave Technology, vol. 7, No. 3, pp. 449–453, Mar. 1989.

Kaczmarski et al., "Design of an Integrated Electro–optic Switch in Organic Polymers", IEE Proceedings, vol. 136, Pt. J, No. 3, pp. 152–158, Jun. 1989.

IEEE Photonics Technology Letters, vol. 3, No. 4, Apr. 1991 New York US, pp. 299–301 "A Three–Electrode Distributed Bragg Reflector Laser with 22nm Wavelength Tuning Range" by Öberg et al.

IEEE Photonics Technology Letters, vol. 4, No. 12, Dec. 1992, pp. 1330–1332 by Woodward et al.

IEEE Photonics Technology Letters, vol. 6, No. 10, Oct. 1994, pp. 1188–1190 by Bouadma et al.

IEEE Journal of Quantum Electronics, vol. 24, No. 12, Dec. 1988, pp. 2423–2432 by Pan et al.

IEEE Journal of Quantum Electronics, vol. 27, No. 3, Mar. 1991, New York US, pp. 778–787 by Tomme et al.

Primary Examiner—Rodney B. Bovernick
Assistant Examiner—Luong-Quyen T. Phan
Attorney, Agent, or Firm—Blakely Sokoloff Taylor & Zafman

[57] ABSTRACT

A laser component having a Bragg reflector, the component comprising a substrate carrying firstly an active emission section of semiconductor materials and secondly a Bragg reflector waveguide extending said active section, means enabling the refractive index of the waveguide to be varied so as to control the wavelength tuning of said laser component, wherein said waveguide is made of organic material(s).

9 Claims, 2 Drawing Sheets

LASER COMPONENT HAVING A BRAGG REFLECTOR OF ORGANIC MATERIAL, AND A METHOD OF MAKING IT

The present invention relates to a laser component having a Bragg reflector, and to a monolithic component integrating such a component. The invention also relates to a method of making such a component.

An advantageous application of the invention lies in the field of optical fiber telecommunications, and more particularly in coherent systems or in wavelength multiplexed links.

BACKGROUND OF THE INVENTION

For the last few years there has been ever increasing interest in distributed Bragg reflector (DBR) semiconductor lasers, in particular in applications with wavelength division multiplexed (WDM) links and in future coherent systems. DBR lasers constitute sources having high temporal coherence (narrow spectrum line width) with emission wavelength tuneability that can be considerable.

A Bragg reflector laser is a monolithic laser structure comprising, at the end of a semiconductive amplifier medium (active section), a passive optical waveguide in which a grating is formed that constitutes a Bragg reflector (Bragg section). The passive optical waveguide may have a portion that does not include any grating, interposed between the amplifying medium and the reflector grating, thereby defining a phase control section in the DBR structure. This section makes it possible to avoid any mode jumping while tuning the DBR section.

Generally, wavelength tuning of such a DBR laser is performed by injecting current into the Bragg section or into the phase matching section. The injection of minority carriers makes it possible to vary the refractive index of the medium and thus to control the Bragg wavelength $\lambda_B$ given by the equation $\lambda_B = \Lambda/2n_{\mathit{eff}}$ where $\Lambda$ is the pitch of the grating and n is the effective refractive index of the medium.

For a more detailed presentation of DBR lasers, reference may advantageously be made to the following publication:

"A theoretical model of multielectrode DBR lasers" by X. Pan, H. Olesen, B. Tromborg, published in IEEE Journal of Quantum Electronics, Vol. 24, No. 12, December 1988.

In spite of considerable progress in the techniques for manufacturing semiconductor components, the manufacture of a Bragg reflector laser remains complex and requires numerous growth and etching steps. Controlling the coupling between the amplifier section and the waveguide section, and choosing the lateral structure of the guide and its electrical and optical confinement, are of great importance for the performance of the resulting component.

In addition, although techniques of tuning by injecting current have the advantage of giving access to wide tuning ranges (10 nm to 12 nm), they are nevertheless the cause of considerable spectrum broadening, and to a decrease in emitted power. These phenomena are associated with fluctuations in the concentration of carriers due to spontaneous emission in the passive section.

Recently, proposals have been made to perform wavelength tuning of DBR lasers by localized heating of their passive sections, with such heating being obtained either by injecting inverse current in the waveguide section or by using thin layer heater resistances.

In this respect, reference may advantageously be made to the following two publications:

"A three-electrode distributed Bragg reflector laser with 22 nm wavelength tuning range" by M. Obert et al., IEEE Photonics Technology Letters, Vol. 3, No. 4, April 1991; and "A DBR laser tunable by resistive heating" by S. L. Woodward et al., IEEE Photonics Technology Letters, Vol. 4, No. 12, December 1992.

Nevertheless, neither of these two tuning techniques by heating is satisfactory.

In both cases, the heating of the waveguide section is not accurately localized and gives rise to an increase in the temperature of the amplifying active section and that in turn degrades the characteristics of the laser (higher threshold currents, lower quantum efficiencies).

In addition, the solution that implements inverse currents gives rise to damage at the electrical junctions of the waveguide section, thereby reducing the performance of the component.

OBJECTS AND SUMMARY OF THE INVENTION

An object of the invention is to propose a component that mitigates these various drawbacks.

To this end, the invention provides a laser component having a Bragg reflector, the component comprising a substrate carrying firstly an active emission section of semiconductor materials and secondly a Bragg reflector waveguide extending said active section, means enabling the refractive index of the waveguide to be varied so as to control the wavelength tuning of said laser component, wherein said waveguide is made of organic material(s).

Such a component is easy to manufacture, organic materials being easy to work: deposition and etching are easy; Bragg gratings can be made by direct etching or by photo-inscription on the waveguide.

It will also be observed that losses in the waveguide portion of such a component are small (less than 1 dB/cm for the emission wavelengths of laser emitters for optical telecommunications (i.e. 1.3 µm and 1.55 µm)).

The component may be tuned by the thermo-optical effect, thereby reducing the effects of spectrum line broadening and emitted power loss that are observed when tuning by injection.

In this case, the Bragg grating may itself be obtained by a thermo-optical effect. The component then includes a grating of heating resistances which induce a refractive index grating on the waveguide.

Compared with semiconductor materials, organic materials have the advantage of being of lower thermal conductivity, such that thermal disturbances induced by heating the Bragg section (and where appropriate the phase control section) on the active section are reduced.

The organic materials of the waveguide are preferably selected so as to present low thermal conductivity, preferably of the order of or less than 1 W/(m.°K) (as compared with about 70 W/(m.°K) for semiconductors) and a high coefficient of variation in refractive index as a function of temperature (dn/dT), preferably greater than $10^{-4}$ °C.$^{-1}$.

In a variant, the component may be tuned by using the electro-optical effect.

The invention also provides a monolithic component integrating at least one Bragg reflector laser component of the above type. It is then advantageous for at least one integrated organic light waveguide to extend the Bragg section of the laser component.

The invention also provides a method of making such a laser component. The method comprises the following steps:

a stack of semiconductor layers corresponding to the structure of the active section is made on the substrate by epitaxial growth;

the lateral structure of said active section is made by etching and repeating epitaxy;

a furrow is made in the resulting structure by masking and dry etching down to the substrate;

an antireflection layer of dielectric material is deposited on the bottom and the sides of the furrow, and also on the outlet face of the active section;

a confinement layer of organic material having a refractive index smaller than that of the core of the waveguide is deposited on said antireflection layer;

a layer of organic material corresponding to the core of the waveguide is deposited on said confinement layer;

a ridge is etched in the organic layers deposited in this way;

where appropriate, the Bragg grating is made on the ridge corresponding to the core of the waveguide;

a top confinement layer of an organic material having a refractive index that is smaller than that of the core of the waveguide is deposited on the ridge and on the antireflection layer;

a dielectric protection layer is deposited on said confinement layer; and layers forming heating resistances are deposited on said dielectric layer.

In an advantageous implementation, after the first organic confinement layer has been deposited, said layer is etched to clear the outlet face of the active section.

The various steps of such a method are simple to implement.

It should also be observed that with such a method it is possible to characterize and to qualify the active section of semiconductor material before the organic waveguide has been made. This makes it possible to save time and expense compared with "all-semiconductor" DBR lasers in which the active section cannot be characterized and qualified until the entire component has been manufactured.

BRIEF DESCRIPTION OF THE DRAWINGS

Other characteristics and advantages of the invention appear from the following description. The description is purely illustrative and non-limiting. It should be read with reference to the accompanying drawings, in which.

MORE DETAILED DESCRIPTION

Figure 1:
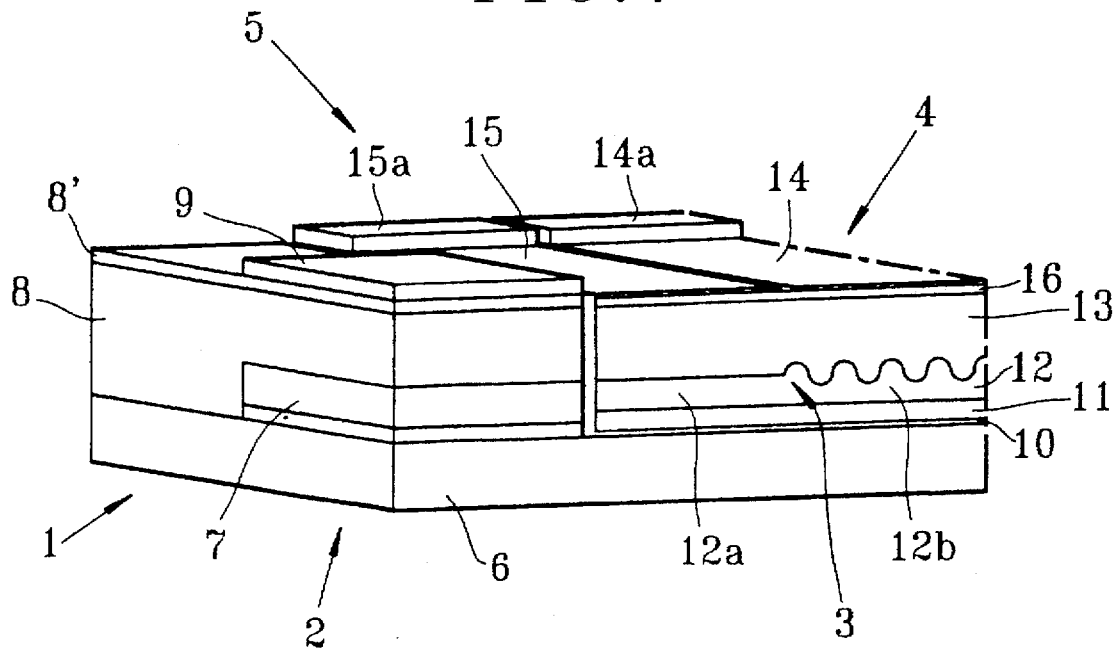
FIG. 1 is a perspective half-view of a component of the invention.
Figure 2:
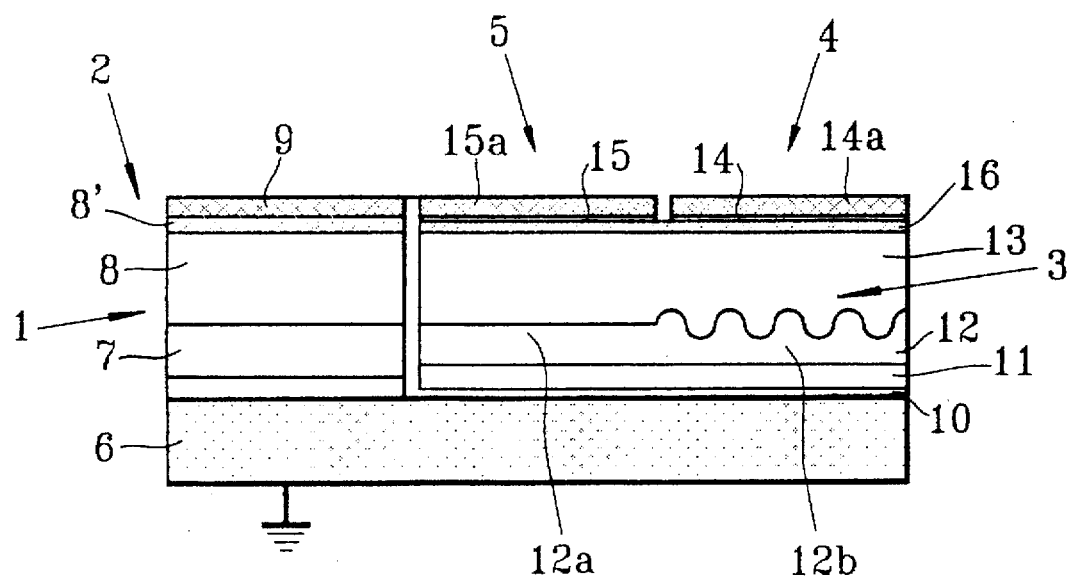
FIG. 2 is a diagrammatic longitudinal section through the component of FIG. 1.

The laser component shown in FIGS. 1 and 2 is given overall reference 1 and comprises a laser amplifying section 2 extended by a waveguide 3. The waveguide 3 includes a Bragg section 4 and a phase control section 5 interposed between the amplifier section 2 and the Bragg section 4.

This monolithic component 1 has an n-doped or semi-insulating (SI) InP substrate 6 common to the various sections 2, 4, and 5. This substrate 6 is electrically connected to ground voltage.

The amplifier section 2 comprises a confinement layer of n-InP type semiconductor material, an active layer 7 of semiconductor material such as GaInAsP that is solid or that has quantum wells, deposited on the n-InP and covered in a p-doped InP layer 8. On the face of the layer 8 remote from the substrate 6 there are deposited a contact layer 8' of a material such as GaInAs and an electrode 9 that enable the active layer 7 to be fed with amplifier current.

The waveguide 3 is made of an organic material and it is deposited on an anti-reflection thin layer 10 carried by the substrate 6 and on the face of the amplifier section.

More particularly, the waveguide 3 is defined by:

a 1.5 µm thick organic confinement layer 11 that is deposited on the antireflection layer 10, said layer 11 having a refractive index n1;

a 1 µm thick organic layer 12 constituting the core of the waveguide 3, said layer 12 being deposited on the layer 11 and having a refractive index n2 greater than n1; and a top organic confinement layer 13 covering the layers 12 and 11, said top organic confinement layer 13 having a refractive index n3 that is greater than n1 and being of a thickness that lies in the range 1.5 µm to 2 µm.

The organic materials of the layer 12 are advantageously selected from polystyrenes (e.g. poly(methyl methacrylate)), polysiloxanes, polysulfones, fluorine-containing polyimides, and deuterium-containing polyamides (some hydrogen atoms substituted by deuterium atoms). These various materials are transparent over a wide range of wavelengths shorter than 1.6 µm.

In the phase control section 5, the layer 12 has a non-etched portion 12a, and in the Bragg section 4 it has an etched portion 12b which, together with the layer 13, defines the grating that constitutes the Bragg reflector.

The face of the layer 13 remote from the substrate 6 carries a strip 14 over the Bragg section 4 and a strip 15 over the phase control section 5, which strips constitute heating resistances.

The strips 14 and 15 are deposited on a dielectric layer 16 that is interposed between said strips and the layer 13.

Each of these heating resistance forming strips 14 and 15 is controlled by a respective pair of electrodes 14a, 15a (only one electrode in each pair being shown in the figures). The two electrodes 14a or 15a in a given pair are disposed on either side of the waveguide 3. The voltages controlled by means of these electrodes at the ends of the strips 14 and 15 are independent and are a function of the temperatures it is desired to impart to the sections 4 and 5.

In this way, by means of the thermo-optical effect, the refractive indices of the organic material constituting the waveguide 3 are controlled both in the section 5 and in the section 4, i.e. both the phase and the wavelength of the emitted light are controlled.

In particular, variation in the Bragg wavelength $\lambda_B$ obtained by a temperature variation $\Delta T$ is given by:

$$\Delta\lambda_B/\lambda_B = \Gamma(dn/dT)\Delta t$$

where $\Gamma$ (dn/dT) is the confinement coefficient of the waveguide, thus giving a tuning range of 12.6 nm for an emission wavelength of 1.55 µm for a temperature variation $\Delta T$ of 80° C., for $\Gamma=0.8$, and for $dn/dT=2\times10^{-4}$.

The power required for this temperature variation is given by:

$$P = \frac{V^2}{R} = \frac{L \cdot d \cdot k(1 + 0.88 e/d)}{e} \Delta T$$

where V is the voltage across the terminals of heating resistance 14, where R is the resistance in ohms of said heating resistance, L and d are its length and its width, e is the total thickness of the organic layer, and k is the thermal conductivity of the organic medium.

In the example shown in FIGS. 1 and 2, the following apply:

L=100 μm, d=50 μm, e=4 μm, ΔT=80° K,
k=0.17 W/(m.°K) and R=5 kΩ which corresponds to a power P of 1.8 mW and to a voltage V of 3 volts.

The laser component 1 as described above is manufactured by implementing the following succession of steps:

1) A stack of semiconductor layers corresponding to the structure of the amplifier section 2 is made by epitaxial growth on the substrate 6, using conventional epitaxial growth techniques: liquid epitaxy, organometallic chemical vapor deposition (OMCVD) epitaxy, molecular beam epitaxy (MBE), with the structure of the active layer being either of the solid type or of the quantum well type.

2) The lateral structure of the section 2 is made so as to obtain a buried laser type structure, by performing etching treatment on the resulting stack and then performing epitaxy again (growth of layer 8 and of layer 8').

3) The substrate is reduced in thickness and both faces of the resulting sample are metallized.

4) A transverse furrow having a depth of 4 μm to 5 μm is formed through the semiconductor layers by masking and etching down to the substrate 6, using a dry etching method (e.g. using etching techniques of the type conventionally known by the abbreviations RIE, RIBE, CAIBE), so as to obtain a smooth and vertical face in the semiconductor constituting the outlet face of the amplifier section 2.

5) The antireflection layer 10 is deposited on the bottom of the furrow made in this way and also on the outlet face of the amplifier section, which layer is constituted by a dielectric material such as SiO or TiO$_2$, the thickness of the layer 10 being λ/4n, where λ is the center emission wavelength of the amplifier section 2, n is the refractive index of said dielectric material such that n=$\sqrt{ns.n2}$ where ns is the refractive index of the semiconductor forming the active zone.

6) Thereafter, the organic confinement layer of thickness 1.5 μm is deposited over the entire area of the furrow, e.g. by centrifuging (which layer may be made of polymethyl methacrylate (PMMA)).

7) The vertical outlet face of the active surface 2 and the top of the section 2 are cleared by etching (deep ultraviolet photography when the organic material is PMMA).

8) The deposited organic material is caused to creep by raising its temperature (to 200° C. for 20 minutes with PMMA) so as to make the thickness of said material in the groove uniform.

9) The organic layer of refractive index n2 and corresponding to the core 12 of the waveguide is deposited by centrifuging (e.g. polystyrene).

10) Dry etching (oxygen RIE) is performed through a metal or dielectric mask in both organic layers deposited in this way so as to define the width of the waveguide (2 μm), the organic ridge made in this way being exactly in line with the active layer 7.

11) The Bragg grating is made on the organic ridge at a given distance from the outlet face of the active section 2.

The Bragg grating may be made, for example, by direct etching through conventional holographic masking, or by photorefractive inscription in the waveguide which constitutes in irradiating the top portion of the waveguide by a system of interference fringes, or else by photochemical writing using a laser.

12) The top optical confinement layer 13 is deposited by centrifuging over the entire furrow (e.g. amorphous Teflon (registered trademark) or the material sold under the trade name polymatrif, or PMMA when the core material is polysulfone).

13) A dielectric protection layer 16 of a material such as SiO$_2$ or Si$_3$N$_4$ is deposited over the entire area of the organic material.

14) The layers 14 and 15 that form the heating resistances are deposited over the portions 12a and 12b. These layers 14 and 15 may, for example, be layers having a thickness of about 1,000 Å of gold, platinum, titanium, or chromium.

The sample obtained in this way is then cut up into a plurality of chips forming the component shown in FIG. 1.

Figure 3:
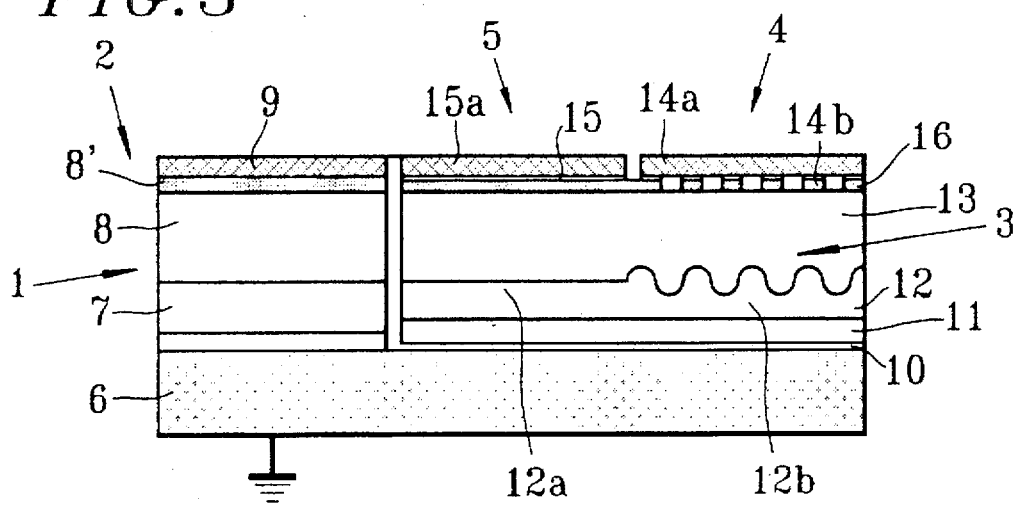
FIG. 3 is a figure similar to FIG. 2 showing a different possible variant of the invention.

In a variant, as shown in FIG. 3, the Bragg grating may be constituted not by etching the layer 12 but by means of a grating of heating resistances 14b replacing the resistance 14. This grating induces a refractive index grating by the thermo-optical effect in the organic waveguide, and its coupling coefficient depends on the voltage applied to the heating resistances 14b.

Naturally, the structure described above can be integrated in monolithic components that have functions other than solely the function of providing laser emission.

Figure 4:
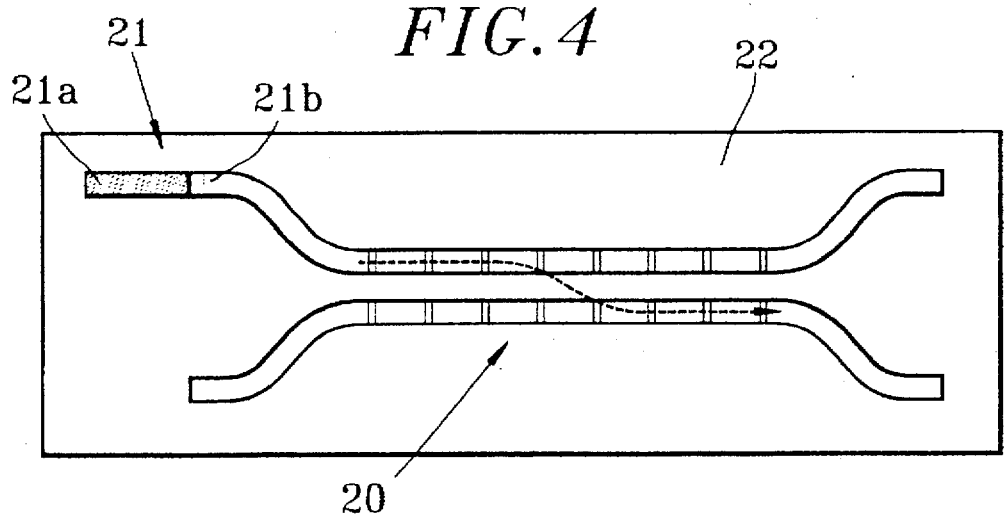
FIGS. 4 and 5 are diagrams of two monolithic components each integrating a component of the invention.

In particular, and as shown in FIG. 4, the structure may be integrated in an organic filter laser component having a common substrate 22 which includes an organic waveguide directional coupler 20 and a DBR laser 21 of the type described with reference to FIGS. 1 to 3, the Bragg section thereof being extended by one of the branches of the coupler 20. In FIG. 4, the active section of the laser 21 is referenced 21a, and its Bragg section 21b.

Figure 5:
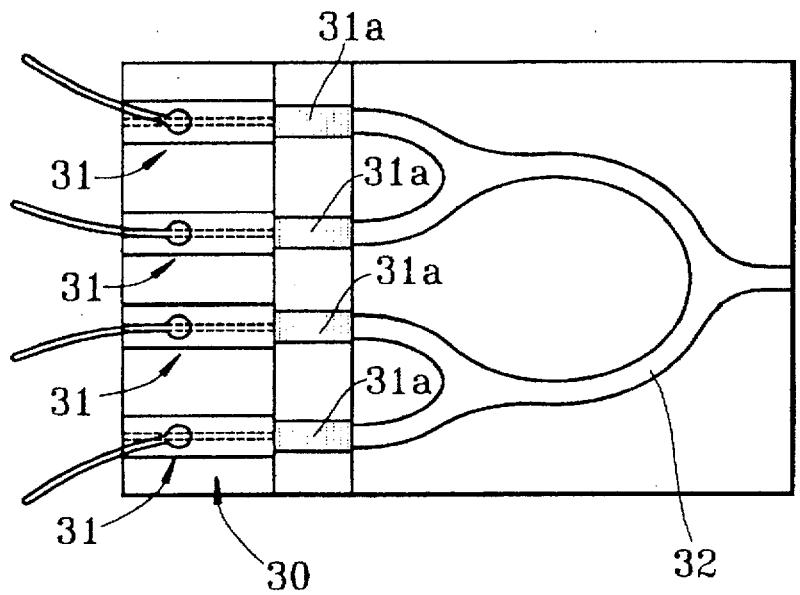

Also, as shown in FIG. 5, organic DBR lasers of the type described with reference to FIGS. 1 to 3 can be integrated to constitute strips 30 having N lasers 31. The Bragg sections 31a of the lasers 31 are advantageously extended by waveguides of organic material belonging to an N-inlet coupling section 32. In FIG. 5, this section 32 constitutes a combiner having N inlets and one outlet.

Other optical functions can naturally be provided at the outlet from the strip. In particular, the section 32 may be replaced by a switching matrix of N inlets by N outlets, constituted by N directional couplers.

Advantageously, when manufacturing such components integrating DBR lasers with other functions, the organic layers of the DBR laser(s) and those of the waveguides that extend it or them are deposited simultaneously.

Naturally, other variants of the invention are possible. In particular, the waveguide core may be made of an electro-optical organic material having non-linear optical (NLO) properties (e.g. doped or grafted polyimides), the DBR laser component having electrodes replacing the heating resistances of the component of FIGS. 1 and 2 for the purpose of applying an electrical field to the waveguide so as to vary the refractive index of its core.

I claim:

1. A Distributed Bragg Reflector (DBR) laser component comprising a substrate with an active emission section of semiconductor materials and a Bragg reflector waveguide extending said active emission section, means enabling the refractive index of the waveguide to be varied so as to control the wavelength tuning of said laser component, wherein said waveguide is made of at least one thermo-optical organic material, and wherein the means enabling the refractive index of the waveguide to be varied include means for heating the Bragg reflector section.

2. A component of claim 1, including an array of heating resistances which induce an array of refractive indices on the waveguide.

3. A component of claim 1, wherein the organic material of the waveguide is of thermal conductivity about or less than 1 W/(m.°K) and has a coefficient of refractive index variation as a function of temperature greater than $10^{-4}$ °C.$^{-1}$.

4. A component of claim 1, wherein the organic material is selected from polystyrenes, polysiloxanes, fluorine-containing polyimides, and deuterium-containing polyimides.

5. A component of claim 1, wherein the organic waveguide includes a grating-free portion interposed between the Bragg section and the active section, said grating-free portion corresponding to a phase control section of the component.

6. A monolithic component integrating at least one Bragg reflector laser component according to claim 1.

7. A monolithic component of claim 6, wherein at least one integrated organic light waveguide extends the Bragg section of the laser component.

8. A method of making a Distributed Bragg Reflector laser component, comprising the following steps:

providing a substrate and forming a stack of semiconductor layers corresponding to the structure of an active emission section on said substrate by epitaxial growth;

forming a lateral structure of said active section by etching and repeating epitaxial growth;

forming a furrow in the resulting structure by masking and dry etching down to the substrate;

depositing antireflection layer of dielectric material on the bottom and the sides of the furrow, and on the outlet face of the active section;

depositing a first confinement layer of organic material having a refractive index smaller than that of the core of the waveguide on said antireflection layer;

depositing a layer of organic material corresponding to the core of the waveguide on said first confinement layer;

etching a ridge in the organic layers deposited in this way;

where appropriate, forming the Bragg grating on the ridge corresponding to the core of the waveguide;

depositing a second confinement layer of an organic material having a refractive index that is smaller than that of the core of the waveguide on the ridge and on the antireflection layer;

depositing a dielectric protection layer on said second confinement layer; and depositing heat resistance layers on said dielectric layer.

9. A method of claim 8, wherein, after the first organic confinement layer has been deposited, said layer is etched to clear the outlet face of the active section.

* * * * *